United States Patent
Tsai et al.

[11] Patent Number: 6,037,201
[45] Date of Patent: Mar. 14, 2000

[54] METHOD FOR MANUFACTURING MIXED-MODE DEVICES

[75] Inventors: Meng-Jin Tsai, Hsinchu Hsien; Cheng-Han Huang, Hsinchu, both of Taiwan

[73] Assignee: United Microelectronics Corp., Hsin-Chu, Taiwan

[21] Appl. No.: 09/040,215

[22] Filed: Mar. 17, 1998

[30] Foreign Application Priority Data

Dec. 30, 1997 [TW] Taiwan ................................. 86119955

[51] Int. Cl.⁷ ..................... H01L 21/336; H01L 21/8238; H01L 21/76
[52] U.S. Cl. ......................... 438/197; 438/221; 438/275; 438/424; 148/DIG. 163
[58] Field of Search ..................................... 438/197, 218, 438/221, 258, 275, 296, 424, 745, 756, 981; 148/DIG. 163

[56] References Cited

U.S. PATENT DOCUMENTS

| | | |
|---|---|---|
| 4,806,500 | 2/1989 | Scheibe ................................. 438/275 |
| 5,177,028 | 1/1993 | Manning ................................. 438/296 |
| 5,254,489 | 10/1993 | Nakata ..................................... 438/258 |
| 5,480,828 | 1/1996 | Hsu et al. ................................. 438/275 |
| 5,502,009 | 3/1996 | Lin .......................................... 438/275 |
| 5,895,254 | 4/1999 | Huang et al. ........................... 438/424 |

OTHER PUBLICATIONS

Wolf et al, "Silicon Processing for the VLSI Era", vol. 1, pp. 514–517, 1986.

Primary Examiner—Michael Trinh

[57] ABSTRACT

A method for manufacturing mixed-mode devices that can eliminate watermarks resulting from the formation of residues at the dead corner space of an inverted trapezium-shaped structure at the upper end of a shallow trench during dual gate-oxide processing operation. This method uses the same chemical processing conditions for etching the oxide layer and the removal of photoresist layer, so that no watermarks remain after the etching and cleaning processes. MOS transistors are formed over the thin gate oxide layer region and the thick gate oxide region are of, two types, each having a different gate oxide layer thickness so that each has a different operating voltage.

11 Claims, 4 Drawing Sheets

METHOD FOR MANUFACTURING MIXED-MODE DEVICES

CROSS-REFERENCE TO RELATED APPLICATION

This application claims the priority benefit of Taiwan application Ser. No. 6,119,955, filed Dec. 30, 1997, the full disclosure of which is incorporated herein by reference.

BACKGROUND OF THE INVENTION

1. Field of Invention

The present invention relates to a method for manufacturing mixed-mode devices. More particularly, the present invention relates to a method for eliminating watermarks in the neighborhood of shallow trench isolation (STI) during the process of fabricating a dual-gate oxide layer.

2. Description of Related Art

FIG. 1 is a cross-sectional view showing a shallow trench isolation structure according to a conventional method. Shallow trench isolation is now common in integrated circuit fabrication because a conventional LOCOS isolation method is incapable of achieving isolation for feature size smaller than 0.3 $\mu$m. However, as shown in FIG. 1, a conventional method of fabricating shallow trench isolation generates an inverted trapezium-shaped structure at the upper end of the shallow trench 16. Hence, in carrying out the fabrication of a dual gate-oxide layer, residual material can easily be trapped inside the dead corner space 18 of the inverted trapezium-shaped structure, thereby causing the watermarks to appear.

Products that utilize a dual gate-oxide layer include DRAM (Dynamic Random Access Memory) or SRAM (Static Random Access Memory). The technique of forming the dual gate-oxide layer is to allow the application of different operating voltages different devices. In fact, design rules fix the applied current and operating voltage permitted for a gate oxide layer having certain thicknesses. For example, for gate length of 0.25 $\mu$m, 0.34 $\mu$m and 0.5 $\mu$m, their current and operating voltages are 50A/2.5V (0.25 $\mu$m), 70A/3.3V (0.34 $\mu$m) and 130A/5V (0.5 $\mu$m).

When mixed-mode devices are needed on a wafer, the first step is to form a dual gate-oxide layer above a semiconductor substrate. For a substrate having shallow trench isolation structure, the first step for forming a dual gate-oxide layer is to deposit a gate oxide layer over the substrate. Thereafter, a thick gate oxide layer region is defined and covered by a photoresist layer, and then a wet etching method is used to remove the gate oxide layer in the thin gate oxide layer region. Next, another gate oxide layer is formed over the substrate. Hence, a thick gate oxide layer region and a thin gate oxide layer region are created simultaneously on each side of a shallow trench isolation structure. In the subsequent step, conventional production techniques are used to form transistors above the thick gate oxide layer region and the thin gate oxide layer region.

FIGS. 2A through 2E are cross-sectional views showing the progression of manufacturing steps in producing mixed-mode devices according to a conventional method. First, as shown in FIG. 2A, a substrate 10 having shallow trench isolation structure 16 formed thereon is provided. The shallow trench isolation structure 16 has an inverted trapezium-shaped protrusion at the upper end, whose top surface is even slightly higher than the top substrate surface. Therefore, a dead corner space 18 is created at the interface between the slide of trench 16 and the substrate 10. Next, a gate oxide layer 12 is formed over the substrate 10 and the trench 16, and then a photoresist layer 14 is formed over the gate oxide layer 12. Thereafter, photolithographic and etching processes are carried out to pattern the photoresist layer 14 so that it covers the region intended to be the thick gate oxide layer.

Next, as shown in FIG. 2B, the exposed gate oxide layer 12 is removed, and then followed by the removal of the photoresist layer. The process of removing the exposed gate oxide layer 12 includes immersing the wafer in a buffered oxide etchant (BOE) to perform a wet etching operation. Consequently, a residual gate oxide layer 12a underneath the photoresist layer 14 remains in the thick gate oxide layer region. Since the gate oxide layer 12a is still covered by the photoresist layer 14, isopropyl alcohol (EPA) cannot be used to dry the wafer. Instead, a spin drying method is used to remove residual etchant solution. Next, the photoresist layer 14 is removed, and then a cleaning operation using solution such as an RCA cleaning solution is used to rinse the wafer surface. However, during the etching process with buffered oxide etchant, a residual photoresist contaminant 28 may be suspended in the etchant solution. Some of this photoresist contaminants 28 may stick to the dead corner space 18, which makes it very difficult to dislodge by spinning. After a subsequent drying operation, these contaminants 28 around the dead corner space 18 and on the substrate surface are even more difficult to remove, and lead to watermarks. Watermarks not only lead to the contamination of diffusion furnace; they also result in the formation of a non-uniform oxide layer, and hence lowering the product yield rate.

Next, as shown in FIG. 2C, a gate oxide layer 22 is formed over the gate oxide layer 12a and the substrate 10, and then the wafer is washed again. This completes the process for forming a dual gate-oxide layer over the substrate 10. The thick gate oxide layer region 32 includes the gate oxide layer 12a and the gate oxide layer 22, while the thin gate oxide layer region includes just the gate oxide layer 22. However, because the contaminants residing in the dead corner space 18 and on the surface of the substrate diffuse out during the fabrication of the gate oxide layer 22, the gate oxide layer 22 is highly non-uniform.

After the aforementioned processes, two different device regions are established, each region having its own operating voltage. The two different device regions are the thick gate oxide layer device region 29 composed of the gate oxide layer 12a and the gate oxide layer 22, and the thin gate oxide device region 19 composed of just one gate oxide layer 22.

Next, as shown in FIG. 2D, subsequent processes for forming a metal oxide semiconductor (MOS) transistor are carried out. First, a heavily doped polysilicon layer 13 is formed over the thick gate oxide layer device region 29 and the thin gate oxide layer device region 19. The heavily doped polysilicon layer 13, preferably having a thickness of about 2000 Å to 3000 Å, can be formed, for example, by a low pressure chemical vapor deposition (LPCVD) process. This is followed by a heat diffusion or an ion implantation process to implant dopants into the polysilicon layer.

Next, as shown in FIG. 2E, the polysilicon layer 13 is patterned to form a gate 13a above the thick gate oxide layer device region 29 and a gate 13b above the thin gate oxide layer device region 19. Thereafter, using the gates 13a and 13b as a mask, an ion-doping operation is carried out to form source/drain regions 17 in the substrate 10 on each side of the gates 13a and 13b. Hence, transistors having different operating voltages are formed above the thick gate oxide layer device region 29 and the thin gate oxide layer device region 19, respectively.

Because the conventional LOCOS isolation method is incapable of achieving isolation for a feature size smaller than 0.3 μm, shallow trench isolation has to be used to isolate the devices. However, the conventional process of forming dual gate-oxide layer creates watermarks over the substrate in the neighborhood of shallow trench isolation structures.

In light of the foregoing, there is a need to provide a method for reducing or eliminating watermarks from the substrate before the fabrication of a dual gate-oxide layer.

SUMMARY OF THE INVENTION

Accordingly, the present invention is to provide a method for manufacturing mixed-mode devices that can remove the watermarks on the sides of a shallow trench isolation structure during the photoresist removing process, and so preventing any contaminants from remaining on the wafer surface. Therefore, gate oxide layer that subsequently formed over the wafer has a uniform thickness. As, there is no contamination of the furnace interior due to contaminant diffusion, and so product yield is increased.

To achieve these and other advantages and in accordance with the purpose of the invention, as embodied and broadly described herein, the invention provides a method for manufacturing mixed-mode devices. The method comprises the steps of providing a substrate having a shallow trench isolation structure already formed thereon, and then forming a first gate oxide layer over the substrate and the trench. Thereafter, a photoresist layer is formed over the first gate oxide layer, and then photolithographic and etching processes are used to form a photoresist layer over the desired thick gate oxide layer region. Next, under the same chemical processing conditions, a portion of the first gate oxide layer is removed followed by the photoresist layer. Later, the remaining first gate oxide layer surface and the exposed substrate surface are cleaned. Then, a second gate oxide layer is formed over the first gate oxide layer and the substrate. Consequently, a thin gate oxide layer region composed of just the second oxide layer and a thick gate oxide layer region composed of the first gate oxide layer and the second gate oxide layer are formed. Finally, MOS transistors are formed over the thin gate oxide layer region and the thick gate oxide layer region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
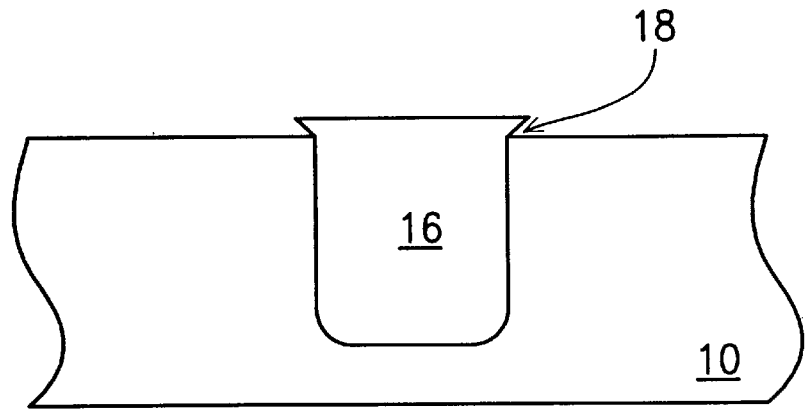
FIG. 1 is a cross-sectional view showing a shallow trench isolation structure according to a conventional method.
Figure 2A:
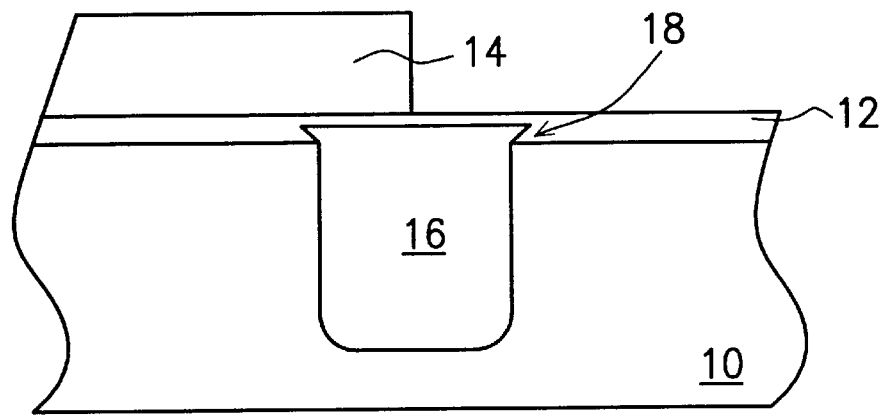
FIGS. 2A through 2E are cross-sectional views showing the progression of manufacturing steps in producing mixed-mode devices according to a conventional method.
Figure 2B:
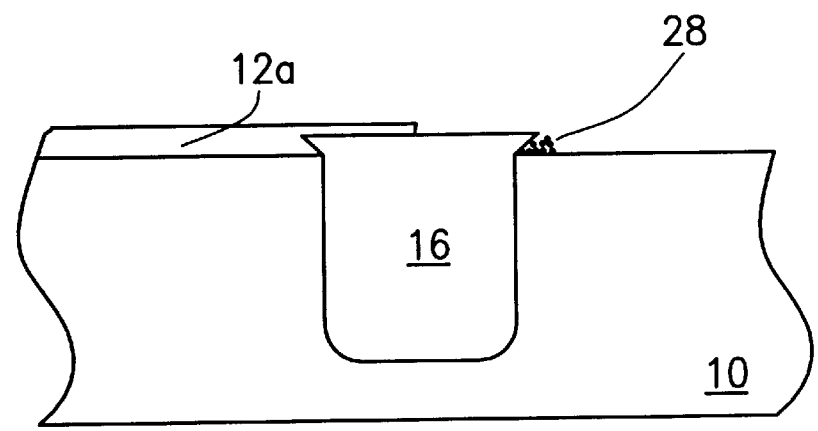
Figure 2C:
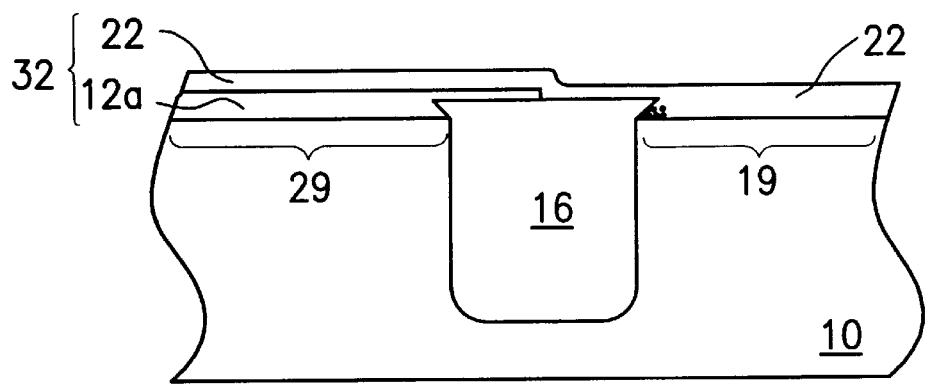
Figure 2D:
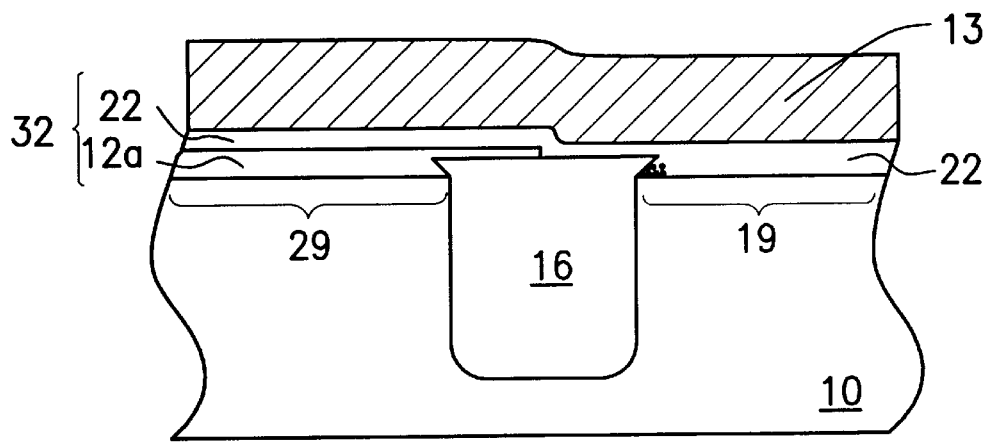
Figure 2E:
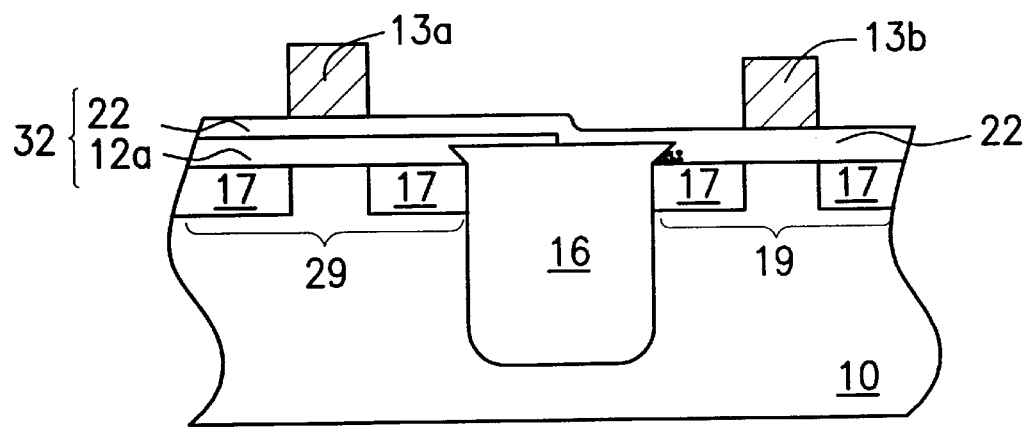

Reference will now be made in detail to the present preferred embodiments of the invention, examples of which are illustrated in the accompanying drawings. Wherever possible, the same reference numbers are used in the drawings and the description to refer to the same or like parts.

Figure 3A:
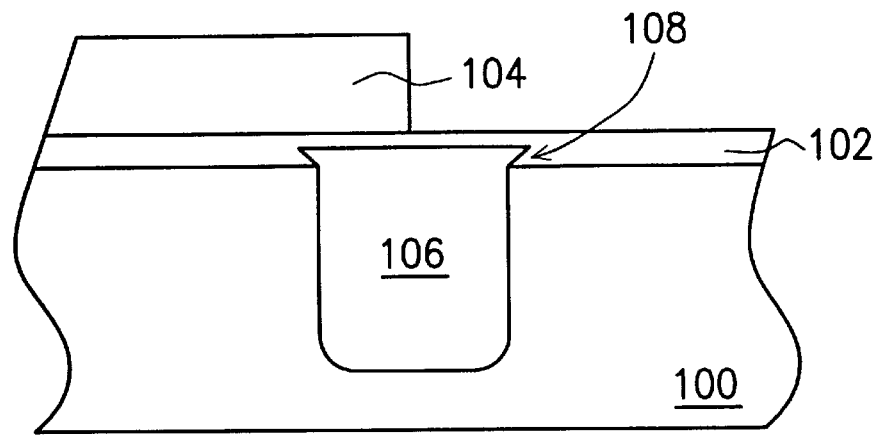
FIGS. 3A through 3E are cross-sectional views showing the progression of manufacturing steps in producing mixed-mode devices according to one preferred embodiment of this invention.

FIGS. 3A through 3E are cross-sectional views showing the progression of manufacturing steps in producing mixed-mode devices according to one preferred embodiment of this invention. First, as shown in FIG. 3A, a substrate 100 having a shallow trench isolation structure 106 formed thereon is provided. The shallow trench isolation structure 106 is formed by first depositing a layer of silicon nitride (not shown in the figure) over the substrate 100 and then patterning the silicon nitride layer to expose the desired shallow trench area. Next, using the patterned silicon nitride layer as a mask, a trench is etched. During the etching process, a portion of the silicon nitride layer in the neighborhood of the trench sidewall will be etched away forming a slant edge. Subsequently, an insulating layer is deposited into the trench, and then the silicon nitride layer is removed thus completing the formation of the shallow trench isolation structure. The resulting trench 106 has an inverted trapezium-shaped structure at the top. Furthermore, the upper surface of the insulating layer is at a level slightly higher than the top of the substrate. Consequently, a dead corner space 108 is formed at the interface between the side of trench 106 and the surface of substrate 100. After forming the shallow trench isolation structure 106, a gate oxide layer 102 and a photoresist layer 104 are sequentially formed over the substrate 100 and the trench 106. Then, a pattern is defined on the photoresist layer 104 covering the desired thick gate oxide layer region.

Figure 3B:
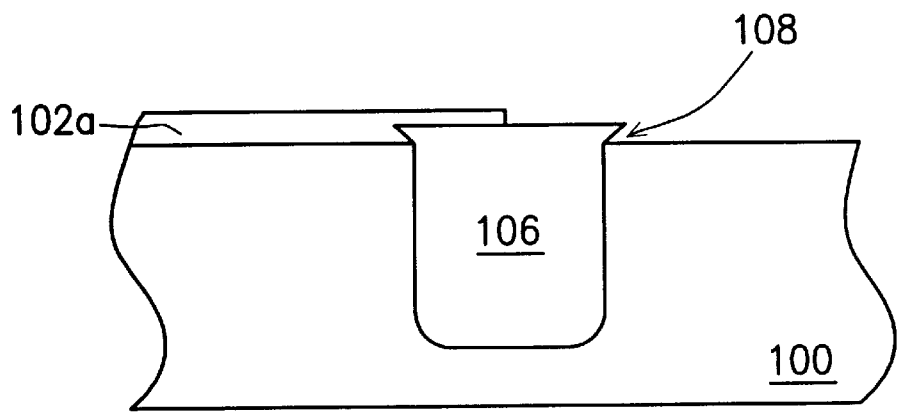

In the conventional method, a drying operation is performed after the removal of a portion of the gate oxide layer 102 but before the removal of the photoresist layer 104. The drying operation results in the contaminants adhering more strongly to the surface of the substrate 100 and in the dead corner space 108 of the inverted trapezium-shaped structure. Therefore, removing the contaminants is made even more difficult. In this invention, as shown in FIG. 3B, the same chemical processing conditions, such as in a wet processing environment are used to etch the gate oxide layer 102 and to remove the photoresist layer 104. For example, a portion of the gate oxide layer 102 is removed by immersing the wafer in a buffer oxide etchant using a wet etching method first. Then, instead of performing a conventional spin drying operation to remove the residual buffer oxide etching solution, the wafer is immersed in water to rinse away the residual buffer oxide etching solution. Next, sulfuric acid ($H_2SO_4$) solution is passed over the wafer to remove the photoresist layer 104 as well as any photoresist contaminants lying in the dead corner space 108. After the above sequence of operations, photoresist residues will be carried away by the sulfuric acid solution. Subsequently, neither a spin drying operation nor a solution drying method such as one using isopropyl alcohol results in a watermark problem. Finally, a cleaning agent such as an RCA cleaning solution is used to clean the wafer. Since the whole etch removing and cleaning operations are carried out in a wet environment, the method used in this invention is able to solve the conventional watermark problem.

Figure 3C:
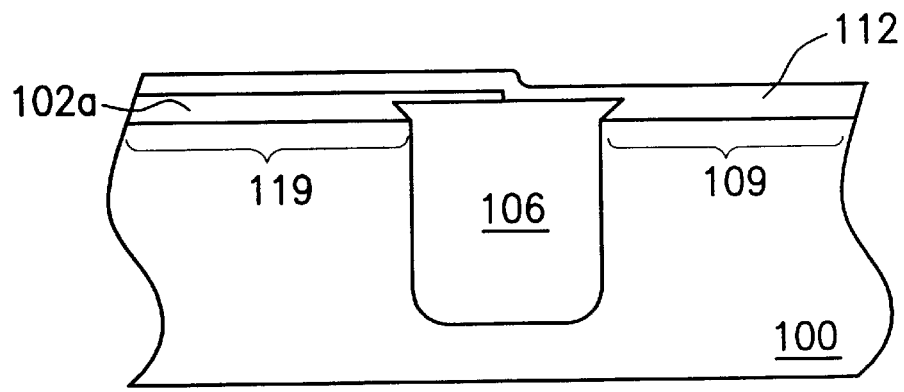

Next, as shown in FIG. 3C, another gate oxide layer 112 is formed over the substrate 100 and the remaining gate oxide layer 102a. Then, another wafer cleaning operation is carried out to complete the processing operations necessary for forming a dual gate-oxide layer. Since photoresist contaminants at the dead corner space 108 and above the surface of the substrate 100 have already been removed, non-uniformity of gate oxide deposition and contamination of pipe furnace due to diffusion can be avoided. Product yield will therefore increase.

After the above processing operations, two types of device regions are formed, each having a different operating voltage. They are a thick gate oxide layer region 119 composed of the gate oxide layer 102a and the gate oxide layer 112, and a thin gate oxide layer region 109 composed of just the gate oxide layer 112.

Figure 3D:
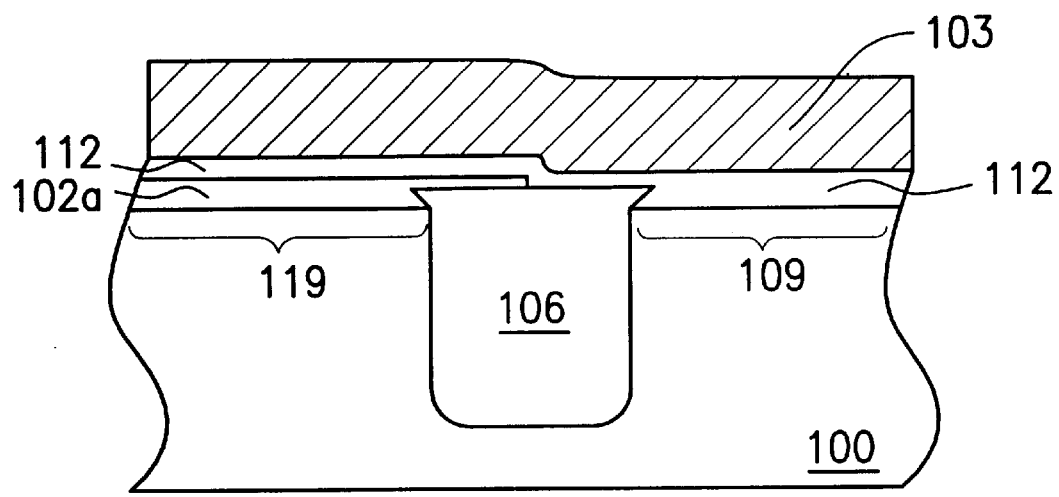

Next, as shown in FIG. 3D, subsequent processes for forming a metal oxide semiconductor (MOS) transistor are carried out. First, a heavily doped layer 103 is layer 103 is formed over the thick gate oxide layer device region 119 and the thin gate oxide layer device region 109. The heavily doped polysilicon layer 103, preferably having a thickness of about 2000 Å to 3000 Å, can be formed, for example, by a low pressure chemical vapor deposition (LPCVD) process. This is followed by a heat diffusion or an ion implantation process to implant dopants into the polysilicon layer.

Figure 3E:
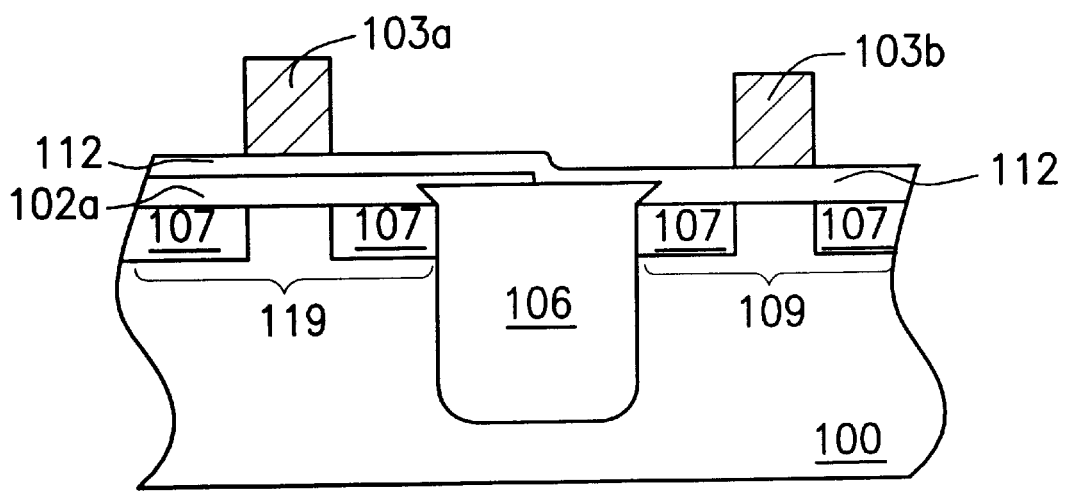

Next, as shown in FIG. 3E, the polysilicon layer 103 is patterned to form a gate 103a above the thick gate oxide layer device region 119 and a gate 103b above the thin gate oxide layer device region 109. Thereafter, using the gates 103a and 103b as a mask, an ion-doping operation is carried out to form source/drain regions 107 in the substrate 100 on each side of gates 103a and 103b. Hence, transistors having different operating voltages are formed above the thick gate oxide layer device region 119 and the thin gate oxide layer device region 109, respectively.

The fabricating method for forming mixed-mode devices according to this invention is able to eliminate the watermark problem caused using a shallow trench isolation structure in the substrate. This is because both the removals of the gate oxide layer and the photoresist layer are carried out in a wet environment. Thus, there are no residual contaminants on the wafer surface to result in a non-uniform gate oxide deposition or to spread pollutants around inside a furnace. Product yield can therefore be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing mixed-mode devices comprising the steps of:

providing a substrate having a plurality of shallow trench isolation structures formed thereon;

forming a first gate oxide layer over the substrate and the shallow trench isolation structures;

forming a photoresist layer over the first gate oxide layer, then using a photolithographic process to pattern the photoresist layer into a plurality of patches covering thick gate oxide layer regions;

etching away a portion of the first gate oxide layer using a wet etching solution;

immersing the substrate, the first gate oxide layer and the shallow trench isolation structures in water to rinse away the wet etching solution;

removing the photoresist layer using an acid solution, wherein the steps of etching the first gate oxide layer, immersing the substrate, and removing the photoresist layer are all performed in same wet chemical processing environment;

forming a second gate oxide layer over the first gate oxide layer and the substrate, creating a plurality of thin gate oxide layer regions covered only by the second gate oxide layer and a plurality of thick gate oxide layer regions covered by the first gate oxide layer and the second gate oxide layer together; and forming a plurality of transistor structures above the thin gate oxide layer region and the thick gate oxide region.

2. The method of claim 1, after removing the photoresist layer further comprising performing a cleaning step, wherein the cleaning step and the step of etching the first gate oxide layer are performed in the same wet chemical processing environment.

3. The method of claim 2, wherein the step of etching the first gate oxide layer and the removal of the photoresist layer includes using a buffered oxide etchant for said etching, water for removing residual buffered oxide etchant, and sulfuric acid ($H_2SO_4$) solution for said removal.

4. The method of claim 3, wherein after the step of etching the first gate oxide layer and the removal of the photoresist layer, further includes a drying operation to remove the residual sulfuric acid solution on the substrate.

5. The method of claim 4, wherein after the step of drying the substrate includes a spin-drying method.

6. The method of claim 4, wherein after the step of drying the substrate includes a solution drying method.

7. The method of claim 6, wherein after the step of drying the substrate includes using an isopropyl alcohol.

8. The method of claim 1, wherein the step of forming the transistor structures includes the steps of:

forming a plurality of gate structures above the thin gate oxide layer region and the thick gate oxide region; and forming a plurality of source and drain regions in the substrate on each side of the gate structures.

9. The method of claim 8, wherein the step of forming the gate structures includes depositing doped polysilicon.

10. The method of claim 8, wherein the step of forming the source and drain regions includes using the gate structures as a mask to carry out a dopants implant operation.

11. A method for manufacturing mixed-mode devices comprising the steps of:

providing a substrate having a plurality of shallow trench isolation structures formed thereon;

forming a first gate oxide layer over the substrate and the shallow trench isolation structures;

forming a photoresist layer over the first gate oxide layer, then using a photolithographic process to pattern the photoresist layer into a plurality of patches covering thick gate oxide layer regions;

etching away a portion of the first gate oxide layer using a buffered oxide etchant;

immersing the substrate, the first gate oxide layer and the shallow trench isolation structures in water to rinse away the wet buffered oxide etchant;

removing the photoresist layer using a sulfuric acid solution;

cleaning the substrate using a cleaning solution, wherein the above steps of etching the first gate oxide layer, immersing the substrate, removing the photoresist layer and cleaning the substrate are all performed in same wet chemical processing environment and performed in the above order;

forming a second gate oxide layer over the first gate oxide layer and the substrate, creating a plurality of thin gate oxide layer regions covered only by the second gate oxide layer and a plurality of thick gate oxide layer regions covered by the first gate oxide layer and the second gate oxide layer together; and forming a plurality of transistor structures above the thin gate oxide layer region and the thick gate oxide region.

* * * * *